United States Patent
Abe et al.

(10) Patent No.: US 6,204,188 B1
(45) Date of Patent: *Mar. 20, 2001

(54) HEAT TREATMENT METHOD FOR A SILICON WAFER AND A SILICON WAFER HEAT-TREATED BY THE METHOD

(75) Inventors: Takao Abe; Norihiro Kobayashi, both of Annaka (JP)

(73) Assignee: Shin-Etsu Handotai Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/966,863

(22) Filed: Nov. 10, 1997

(30) Foreign Application Priority Data

Nov. 22, 1996 (JP) .................................. 8-327734

(51) Int. Cl.$^7$ ......................................... H01L 21/302
(52) U.S. Cl. ........................ 438/706; 438/714; 438/715
(58) Field of Search .............................. 438/795, 796, 438/715, 745, 663, 756, 762, 770, 714, 706

(56) References Cited

U.S. PATENT DOCUMENTS

| | | | |
|---|---|---|---|
| 4,432,809 | 2/1984 | Chye et al. | |
| 4,784,975 | * 11/1988 | Hofmann et al. | 438/308 |
| 4,868,133 | * 9/1989 | Huber | 438/471 |
| 5,011,794 | * 4/1991 | Grim et al. | 438/796 |
| 5,171,708 | * 12/1992 | Katayama et al. | 438/558 |
| 5,210,056 | * 5/1993 | Pong et al. | 438/773 |
| 5,279,973 | * 1/1994 | Suizu | 438/795 |
| 5,290,361 | * 3/1994 | Hayashida et al. | 134/2 |
| 5,308,400 | * 5/1994 | Chen | 134/2 |
| 5,334,556 | * 8/1994 | Guldi | 438/308 |
| 5,352,615 | 10/1994 | Limb et al. | |
| 5,445,975 | 8/1995 | Gardner et al. | |
| 5,516,730 | * 5/1996 | Saeed et al. | 438/473 |
| 5,534,294 | * 7/1996 | Kubota et al. | 438/476 |
| 5,580,816 | * 12/1996 | Hemmenway et al. | 438/449 |
| 5,677,208 | * 10/1997 | Itou et al. | 438/199 |
| 5,851,892 | * 12/1998 | Lojek et al. | 438/305 |

FOREIGN PATENT DOCUMENTS

| | | |
|---|---|---|
| A1-41 42 466 | 6/1993 | (DE) . |
| 7-45622 | 2/1995 | (JP) . |
| 7-165495 | 6/1995 | (JP) . |

* cited by examiner

*Primary Examiner*—Benjamin L. Utech
*Assistant Examiner*—Binh X. Tran
(74) *Attorney, Agent, or Firm*—Oliff & Berridge, PLC

(57) ABSTRACT

There is disclosed a heat treatment method for a silicon wafer. A silicon wafer, on which a natural oxide film is formed at least at the surface thereof, is loaded directly into a heat treatment furnace heated to a temperature within a temperature range of 1000° C. to the melting point of silicon. Subsequently, the silicon wafer is heat-treated at a temperature within the temperature range, and the silicon wafer having a temperature within the temperature range is unloaded from the heat treatment furnace immediately after the heat treatment is completed. The heat treatment method can be performed at low cost, and can remove crystal defects within a short period of time, with no use of gas endangering safety such as hydrogen.

24 Claims, 2 Drawing Sheets

HEAT TREATMENT METHOD FOR A SILICON WAFER AND A SILICON WAFER HEAT-TREATED BY THE METHOD

BACKGROUND OF THE INVENTION

1. Field of the Invention

The present invention relates to a heat treatment method for reducing in a simple and reliable manner micro-defects which exist in the surface of a single-crystal wafer of semiconductor silicon. The present invention also relates to a silicon wafer which is heat-treated by the above method.

2. Description of the Related Art

Along with a recent tendency to increase the degree of integration and precision of semiconductor integrated circuits, there has been an increasing demand for semiconductor silicon wafers having larger diameters and higher quality. Such silicon wafers are manufactured in a manner in which a cylindrical single-crystal silicon ingot is sliced into wafers, and the surfaces of the sliced wafers are then mirror-polished. A single-crystal silicon ingot is usually manufactured by the Czochralski method (pulling method).

CZ silicon wafers manufactured from a single-crystal silicon ingot grown by the Czochralski method contain micro-defects which are generated due to precipitation of oxygen or the like and which serve as nuclei of oxidation induced stacking faults and crystal defects (grown-in defects) called COP (crystal originated particles). The presence of these defects is a cause of a deterioration in electric characteristics of semiconductor devices; for example, an increase in leak current and a reduction in oxide dielectric breakdown voltage.

Accordingly, in order to prevent the aforementioned crystal defects from generating in a grown crystal in the stage of growing a single-crystal silicon ingot by the Czochralski method, various efforts are made to increase purity of material or members used and to determine appropriate conditions of crystal growth. For example, growing crystal at a low pulling rate is reported to be effective for reducing COP. However, at such a low growth rate, nuclei of oxidation induced stacking faults cannot be reduced in number. Particularly, when a crystal having as large a diameter as 300 mm or more is grown at such a low growth rate, nuclei of oxidation induced stacking faults are reported to even increase in number and occur densely in a ring-shaped area.

Thus, there have been developed methods of suppressing the generation of oxidation induced stacking faults in silicon wafers by heat treatment even when micro-defects, which serve as nuclei of oxidation induced stacking faults, are generated in a single-crystal silicon ingot in its growing stage, and silicon wafers manufactured from the single-crystal silicon ingot also contain crystal defects.

One of these methods is disclosed in Japanese Patent Application Laid-Open (kokai) No. 7-165495. According to heat treatment described in the publication, silicon wafers are subjected to heat treatment in a hydrogen gas atmosphere at a temperature ranging from 1000° C. to 1350° C. for at least 30 minutes to thereby reduce the density of oxidation induced stacking faults.

This method is effective to a certain degree for the reduction of oxidation induced stacking faults in the surface of a wafer. However, the method is dangerous due to the use of hydrogen gas as a heat treatment ambient gas. Further, a heat treatment apparatus must employ a special explosion-proof feature, which makes the apparatus complex and expensive and involves complicated operations. Also, the heat treatment time is relatively long. From the viewpoint of the process time extending from loading of wafers into a heat treatment furnace to unloading therefrom, the method is poor in productivity and high in cost. Additionally, the surfaces of the thus-heat-treated wafer still contain approximately 50 oxidation induced stacking faults per square centimeter.

A heat treatment method which does not use hydrogen is proposed in Japanese Patent Application Laid-Open (kokai) No. 7-45622. According to this method, until wafers reach a temperature of 1100° C. to 1200° C., in a non-oxidation atmosphere the wafers are heated at such a temperature-rising rate as not to cause slip dislocation in the wafers, and then cooled at such a temperature-lowering rate as not to cause slip dislocation in the wafers.

This method is also effective to a certain degree for the reduction of oxidation induced stacking faults, but requires a relatively long time for heat treatment. Particularly, such a temperature-rising or -lowering rate as not to cause slip dislocation in a wafer means, for example, 20° C./min to 30° C./min, indicating that time required for loading wafers into or unloading from a heat treatment furnace is relatively long. Thus, the overall process time covering loading, heat treatment, and unloading is relatively long, so that this method is also poor in productivity and high in cost.

As described above, conventionally, silicon wafers have been heat-treated in batches. In order to prevent slip dislocation from generating in peripheral portions of wafers, wafers at room temperature are gradually loaded at a speed of 15 cm/min into a heat treatment furnace maintained at a temperature lower than 1000° C. Upon completion of loading, the heat treatment furnace is heated to a desired temperature at a slow rate of, for example, 10° C./min. After the wafers are heat-treated at the desired temperature, the heat treatment furnace is cooled to a temperature lower than 1000° C. at a slow rate of, for example, 5° C./min. Thereafter, the heat-treated wafers are unloaded from the heat treatment furnace at a slow speed; for example, a speed identical to the loading speed.

Accordingly, as mentioned previously, each step of the heat treatment process, specifically loading of wafers into a heat treatment furnace, temperature raising, heat treatment, temperature lowering, and unloading, requires a relatively long time. As a result, the overall productivity of the heat treatment process is reduced, and the heat treatment cost increases significantly.

SUMMARY OF THE INVENTION

The present invention has been accomplished to solve the above-mentioned problems, and an object of the present invention is to provide a low-cost heat treatment method for a silicon wafer capable of removing crystal defects and micro-defects which are present in the vicinity of the surface of a silicon wafer and serve as nuclei of oxidation stacking faults, in a simple and reliable manner and within a short period of time, with no use of gas endangering safety such as hydrogen, and no use of a special apparatus associated with use of such a dangerous gas.

Another object of the present invention is to provide a silicon wafer manufactured in accordance with the above heat treatment method.

To achieve the above object, the present invention provides a heat treatment method for a silicon wafer comprising the steps of: loading a silicon wafer, on which a natural oxide film is formed at least at the surface thereof, directly into a heat treatment furnace heated to a temperature within the range of 1000° C. to the melting point of silicon; heat-treating the silicon wafer at a temperature within the range; and unloading the silicon wafer having a temperature within the range from the heat treatment furnace immediately after the heat treatment is completed.

When wafers are subjected to the above-described heat treatment, micro-defects which serve as nuclei of oxidation induced stacking faults can be reduced.

As mentioned above, a silicon wafer is loaded directly into a high-temperature heat treatment furnace and unloaded from the furnace immediately after the heat treatment is completed. Thus, loading and unloading operations are completed in a negligibly short period of time, and temperature-raising and -lowering operations are not involved, thereby carrying out the heat treatment process in a very short period of time.

Also, hydrogen is not used as an ambient gas for heat treatment, so that an ordinary heat treatment furnace can be employed for heat treatment of silicon wafers.

In the method of the present invention, a natural oxide film must be formed on the surfaces of a silicon wafer to be heat-treated. This prevents the surfaces of a silicon wafer from altering due to thermal nitriding or etching which would otherwise be induced by heat treatment, and from being contaminated with impurities.

Preferably, the natural oxide film is intentionally formed by cleaning a silicon wafer to be heat-treated in an acid or alkali cleaning solution containing hydrogen peroxide.

A natural oxide film formed merely by allowing a silicon wafer to stand in the atmosphere or by rinsing a silicon wafer in pure water is thin and coarse, so that the aforementioned alteration or contamination may not be prevented. In actuality, the thus-formed natural oxide film itself may be contaminated while being left in the atmosphere.

Preferably, a silicon wafer is heat-treated at a temperature ranging from 1200° C. to 1350° C.

Heat treatment in such a high temperature range efficiently annihilates micro-defects which serve as nuclei of oxidation induced stacking faults, and reduces heat treatment time. Thus, wafers are less contaminated.

Preferably, an ambient gas for heat treatment is nitrogen, inert gas, a mixture of nitrogen and inert gas, or a mixture of any of these gases and oxygen and/or water vapor.

Such an ambient gas prevents the surface of a wafer from altering or being contaminated during heat treatment.

Preferably, the time of heat treatment is 1 second to 2 minutes.

In the present invention, through heat treatment over such a short period of time, micro-defects which serve as nuclei of oxidation induced stacking faults of various sizes can be sufficiently annihilated, thereby improving productivity.

The present invention provides a silicon wafer which is heat-treated by the method of the invention, thereby having few micro-defects which serve as nuclei of oxidation induced stacking defects. Therefore, silicon wafers of considerably high quality can be obtained.

As described above, in the present invention, through heat treatment over a very short period of time, micro-defects which serve as nuclei of oxidation induced stacking faults in the surfaces of silicon wafers can be sufficiently annihilated. In addition, since the heat treatment does not use any dangerous gas such as hydrogen, a special apparatus is not required. Therefore, the present invention enables silicon wafers of high quality to be manufactured at lower cost, and can be valuably utilized in the industries.

DESCRIPTION OF THE INVENTION AND A PREFERRED EMBODIMENT

The present invention will be further described below in detail, but is not limited thereto.

The present inventors have thought that in conventional heat treatment methods for silicon wafers, nuclei of oxidation induced stacking faults tend to grow due to wafers being gradually heated from room temperature to a certain high temperature; consequently, wafers must undergo high-temperature heat treatment for 30 minutes or longer in the aforementioned hydrogen ambient or non-oxidation ambient in order to annihilate the grown nuclei.

At a high temperature of 1200° C. or higher, nuclei of oxidation induced stacking faults begin to melt. For example, when nitrogen is used as an ambient gas, nitrogen supplies vacancies into a wafer through the surface thereof, and nuclei of oxidation induced stacking faults at the surface of the wafer can be annihilated very effectively. Nevertheless, heat treatment must be carried out for a long time of 30 minutes or longer in a hydrogen ambient or non-oxidation ambient as mentioned above. This is because a wafer is gradually heated to a high temperature at which nuclei of oxidation induced stacking faults are annihilated, and consequently nuclei have grown during this gradual temperature rise.

The present inventors, therefore, have taken an approach of heating a wafer to a desired high temperature as quick as possible instead of gradually so as not to allow growth of nuclei of oxidation induced stacking defects, whereby the nuclei are annihilated by high-temperature heat treatment over a short period of time. The present invention was accomplished based on the above-described idea.

Specifically, a silicon wafer is directly loaded into a heat treatment furnace maintained at a desired high temperature and unloaded from the furnace immediately after the heat treatment is completed, in contrast with a conventional method in which a wafer is gradually loaded into a heat treatment furnace, the furnace is then gradually heated to a desired high temperature, the furnace is gradually cooled after the heat treatment is completed, and then the wafer is gradually unloaded from the furnace.

Since a silicon wafer does not undergo gradual heating and cooling, existing nuclei of oxidation induced stacking faults remain ungrown. Thus, the nuclei can be annihilated by high-temperature heat treatment over a short period of time.

According to the present invention, the heat treatment time can be significantly reduced, so that productivity is far improved as compared with conventional methods. Further, since the method of the present invention requires no special apparatus, such as that required when hydrogen gas is used, low-cost heat treatment is achieved.

An embodiment of the present invention will now be described with reference to the drawings.

Figure 1:
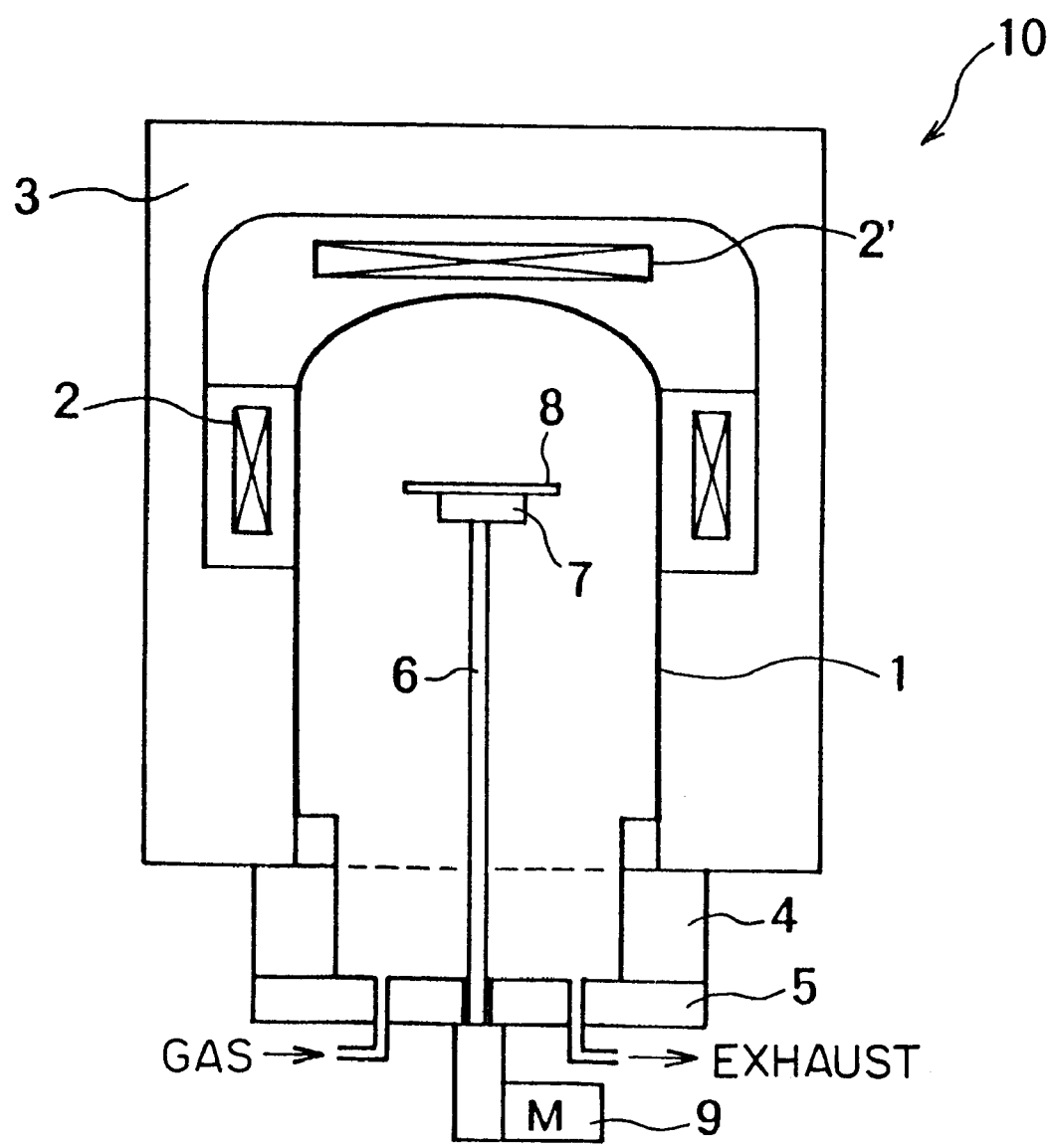
FIG. 1 is a schematic sectional view showing an example of a heat treatment furnace for heat-treating a wafer at a high temperature according to the present invention.

FIG. 1 shows an example of a heat treatment furnace for heat-treating a wafer at a high temperature according to the method of the present invention.

A heat-treatment furnace 10 of FIG. 1 includes a bell jar 1 which is formed from, for example, silicon carbide and in which a wafer is heat-treated. Heaters 2 and 2' surround the bell jar 1 so as to heat the bell jar 1. The heater 2' is separated from the heater 2 along a vertical direction. Also, power supplied to the heater 2' is independent of that to the heater 2 for independent power control between the heaters 2 and 2'. The heating method is not limited thereto, but so-called radiation heating and induction heating may also be applicable. The bell jar 1 and the heaters 2 and 2' are housed in a housing 3 serving as a heat shield.

A water-cooled chamber 4 and a base plate 5 are arranged at the lower portion of a furnace so as to isolate the interior of the bell jar 1 from the atmosphere. A wafer 8 is held on a stage 7, which is attached to the top end of a support shaft 6, which, in turn, is moved vertically by means of a motor 9. In order to load a wafer into or unload from the furnace along a horizontal direction, the water-cooled chamber 4 has an unillustrated wafer port which is opened and closed by means of a gate valve. A gas inlet and a gas outlet are provided in the base plate 5 so that the gas ambient within the furnace can be adjusted.

In the heat treatment furnace 10 having the above-described structure, a heat treatment method of the present invention is carried out in the procedure described below.

First, the interior of the bell jar 1 is heated to a desired temperature ranging from 1000° C. to the melting point of silicon by the heaters 2 and 2' and is then held at the desired temperature. Through mutually independent control on power supplied to the heaters 2 and 2', a temperature distribution can be established within the bell jar 1 along a vertical direction. Accordingly, the heat-treatment temperature of a wafer is determined by the position of the stage 7, i.e. the amount of insertion of the support shaft 6 into the furnace.

In a state in which the interior of the bell jar 1 is maintained at a desired temperature, a wafer is inserted through the wafer port of the water-cooled chamber 4 by an unillustrated wafer handling apparatus arranged by the heat treatment furnace 10. The inserted wafer is placed in, for example, an SiC boat provided on the stage 7 which is situated at the bottom standby position. Since the water-cooled chamber 4 and the base plate 5 are water-cooled, the wafer located at this standby position is not heated to a high temperature.

Upon completion of placing the wafer on the stage 7, the motor 9 is immediately driven to insert the support shaft 6 into the furnace so that the stage 7 is raised to a heat treatment position where a desired temperature ranging from 1000° C. to the melting point of silicon is established (hereinafter referred to as the "desired temperature position"), thereby heat-treating the wafer at the temperature. In this case, only approximately 20 seconds, for example, is required for moving the stage 7 from the bottom standby position in the water-cooled chamber 4 to the desired temperature position.

The stage 7 is halted at the desired temperature position for a predetermined time, thereby subjecting the wafer to high-temperature heat treatment over the halting time. Upon elapse of the predetermined time to complete high-temperature heat treatment, the motor 9 is immediately driven to withdraw the support shaft 6 from the interior of the furnace down to the bottom standby position in the water-cooled chamber 4. This lowering motion can be completed in approximately 20 seconds, for example. The wafer on the stage 7 is quickly cooled, since the water-cooled chamber 4 and the base plate 5 are water-cooled. Finally, the wafer is unloaded from inside the water-cooled chamber 4 by the wafer handling apparatus, thus completing the heat treatment.

When there are more wafers to be heat-treated, these wafers can be sequentially loaded into and heat-treated in the heat treatment furnace 10 maintained at a predetermined high temperature.

As described above, according to the present invention, a silicon wafer is directly loaded into a heat treatment furnace heated to a temperature ranging from 1000° C. to the melting point of silicon, the silicon wafer undergoes heat treatment at a temperature of the range, and then the silicon wafer heated to a temperature of the range is unloaded from the heat treatment furnace immediately after the heat treatment is completed. This means that the present invention does not involve the operations of gradually loading a wafer into and unloading from a heat treatment furnace and raising and lowering the temperature of the heat treatment furnace.

Of course, moving a wafer to a desired heat treatment position in a furnace requires a certain time, which depends on the capability of a moving apparatus and may range from several seconds to several minutes.

Since a silicon wafer is not subjected to gradual heating and cooling in a low-temperature zone, nuclei of oxidation induced stacking faults do not grow. Thus, through heat treatment over a short period of time, nuclei of oxidation induced stacking faults can be reliably annihilated. Further, since the overall time of the heat treatment process can be reduced, an improvement in productivity and cost is attained.

Since hydrogen is not used as an ambient gas, an ordinary heat treatment furnace can be used, thereby avoiding danger which would otherwise be involved.

In the present invention, a natural oxide film must be formed on the surfaces of a silicon wafer to be heat-treated. This means that heat treatment of the present invention must not be carried out immediately after a silicon wafer undergoes etching or cleaning with hydrofluoric acid, which removes an oxide film from the surfaces of a silicon wafer.

If no natural oxide film exists on the surfaces of a silicon wafer, heat treatment of the present invention will alter the surfaces of a silicon wafer due to thermal nitriding or etching or cause contamination with impurities.

Preferably, this natural oxide film is intentionally formed by cleaning a silicon wafer to be heat-treated in an acid or alkali cleaning solution containing hydrogen peroxide.

Silicon wafers are always cleaned before heat treatment. Therefore, if a natural oxide film is formed in the cleaning step, no additional step is required, and therefore the process can be made efficient. A natural oxide film formed merely by allowing a silicon wafer to stand in the atmosphere or rinsing a silicon wafer in pure water is thin and coarse, so that the alteration or contamination of the surfaces of a wafer may not be prevented in heat treatment. In actuality, the thus-formed natural oxide film itself may be contaminated while being left in the atmosphere.

Examples of acid containing hydrogen peroxide include a mixture of hydrochloric acid and hydrogen peroxide, while examples of alkali include a mixture of hydrogen peroxide and $NH_3$, KOH, and NaOH. The present invention is not limited thereto. Any other cleaning solutions capable of causing a fine natural oxide film to be formed on the surfaces of a wafer are acceptable.

The temperature of heat treatment according to the present invention ranges from 1000° C. to the melting point of silicon, particularly from 1200° C. to 1350° C.

The temperature range of 1000° C. to the melting point of silicon is effective for annihilation of micro-defects which serve as nuclei of oxidation induced stacking faults. However, a temperature in excess of 1350° C. is close to the melting point of silicon; consequently, the shape of a wafer may deform, and continuously operating a heat treatment furnace at such a high temperature may raise a problem in heat resistance of the heat treatment furnace. Also, a temperature lower than 1200° C. slows the rate of annihilation of nuclei of oxidation induced stacking faults, resulting in longer time of heat treatment. As the time of heat treatment increases, a wafer is more likely to be contaminated.

Accordingly, a heat treatment temperature ranging from 1200° C. to 1350° C. enables efficient annihilation of micro-defects which serve as nuclei of oxidation induced stacking faults, and allows the time of heat treatment to be reduced, thereby reducing contamination of a wafer.

In the present invention, the time of heat treatment is preferably 1 second to 2 minutes.

In the present invention, nuclei of oxidation induced stacking faults do not grow, so that heat treatment for at most 2 minutes is sufficient. If a wafer is heat-treated for over 2 minutes, the wafer may be contaminated. Also, for reliable annihilation of oxidation induced stacking faults, a wafer is preferably heat-treated for at least 1 second or so.

As described above, heat treatment according to the present invention can sufficiently annihilate micro-defects which serve as nuclei of oxidation induced stacking faults, within a very short period of time.

In the present invention, a preferred ambient gas for heat treatment is nitrogen, inert gas, a mixture of nitrogen and inert gas, or a mixture of any of these gases and oxygen and/or water vapor.

Such a gas ambient, in combination with a natural oxide film formed on a wafer, suppresses alteration or contamination of the surfaces of a wafer during heat treatment. For example, using nitrogen as an ambient gas does not involve contamination of a wafer or danger as in the case where hydrogen is used. However, if silicon and nitrogen react with each other on the surfaces of a wafer, the surfaces will be nitrided. Therefore, a natural oxide film must be formed on the surfaces of a wafer. In this case, since high-temperature heat treatment in a 100% nitrogen ambient may cause a natural oxide film to evaporate with resultant partial nitriding of the surfaces of a wafer, adding a small amount of oxygen or water vapor to nitrogen is more effective.

EXAMPLES

The present invention will now be described by way of example.

First, a single-crystal silicon ingot, 6 inches (approx. 155 mm) dia., p type, 8–12 Ω·cm, orientation: <100> was pulled by the Czochralski method. A single-crystal silicon ingot is usually pulled at a speed of approximately 1 mm/min or more, but was intentionally pulled at a speed of approximately 0.75 mm/min so that nuclei of oxidation induced stacking defects were more likely to generate in a ring shape in the grown crystal bar.

Next, six silicon mirror-polished wafers having a diameter of 6 inches (150 mm) were manufactured from the thus-obtained crystal bar in accordance with the normal procedure composed of slicing, chamfering, lapping, etching, and polishing.

In the final cleaning step, these silicon mirror wafers were cleaned in a mixture solution of hydrogen peroxide and $NH_3$ and then rinsed with pure water to thereby form a natural oxide film having a thickness of approximately 20 angstroms on the surfaces of the wafers.

Example 1

One of the aforementioned six silicon wafers was subjected to high-temperature heat treatment according to the present invention in the heat treatment furnace of FIG. 1.

Heat treatment was carried out in a gas ambient consisting of 99% of nitrogen and 1% of oxygen at 1250° C. for 1 second.

Figure 2:
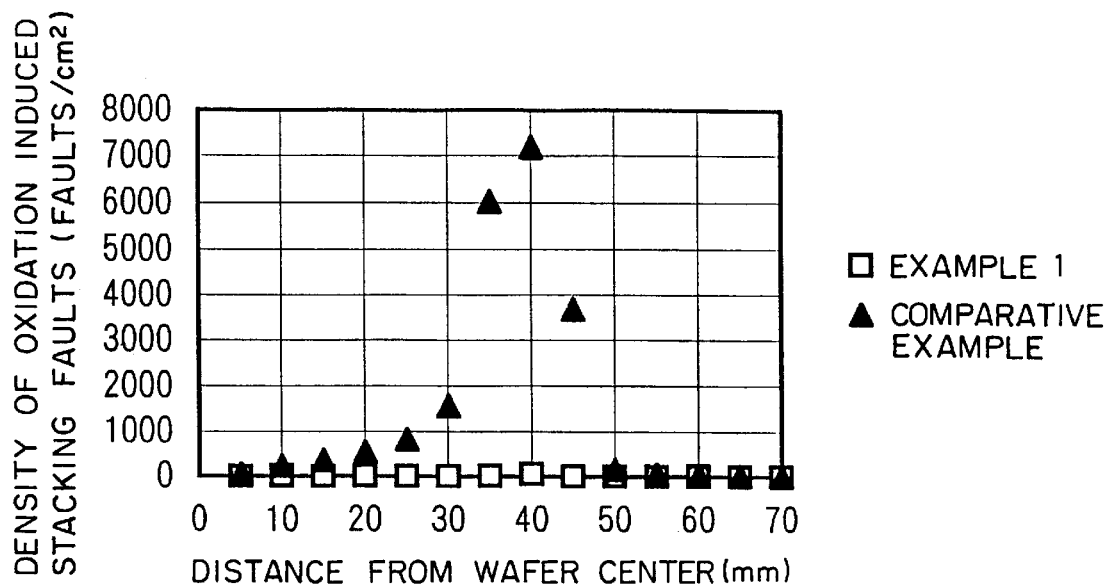
FIG. 2 is a graph showing test results of Example 1 and Comparative Example 1.
Figure 3:
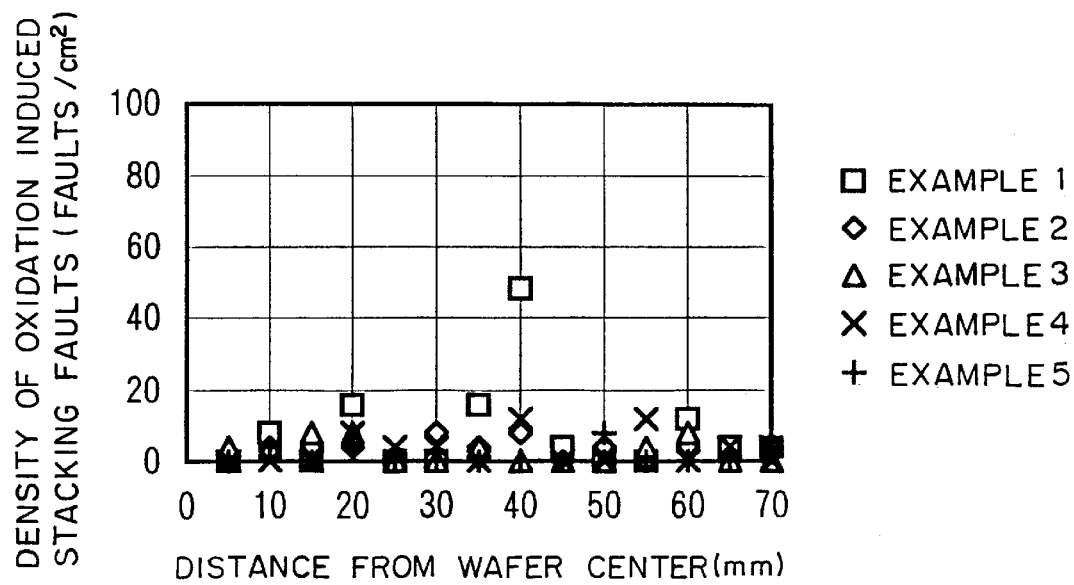
FIG. 3 is a graph showing test results of Examples 1 to 5.

Subsequently, the wafer underwent the normal preparatory treatment for measurement of oxidation induced stacking faults. Specifically, the wafer underwent heat treatment at 1200° C. for 100 minutes in a pyrogenic oxidation ambient. Further, the surfaces of the wafer were lightly etched with a mixed acid of hydrofluoric acid, nitric acid, dichromic acid, and acetic acid. Thereafter, the density of oxidation induced stacking faults was measured through a microscope at intervals of 5 mm from the center of the wafer. Measurements of the density of oxidation induced stacking faults were up to 50 faults/cm$^2$. (See FIGS. 2 and 3.)

Comparative Example

Another one of the aforementioned six silicon wafers was not subjected to heat treatment according to the present invention and measured for the density of oxidation induced stacking faults. As a result, the measured maximum density of oxidation induced stacking faults was in excess of 7000 faults/cm$^2$. (See FIG. 2.)

Example 2

A further one of the aforementioned six silicon wafers was subjected to high-temperature heat treatment according to the present invention under conditions similar to those of Example 1 except that the time of heat treatment was 5 seconds. Subsequently, the wafer was measured for the density of oxidation induced stacking faults. As a result, measurements of the density of oxidation induced stacking faults were up to 20 faults/cm$^2$. (See FIG. 3.)

Example 3

Still another one of the aforementioned six silicon wafers was subjected to high-temperature heat treatment according to the present invention under conditions similar to those of Example 1 except that the time of heat treatment was 10 seconds. Subsequently, the wafer was measured for the density of oxidation induced stacking faults. As a result, measurements of the density of oxidation induced stacking faults were up to 20 faults/cm$^2$. (See FIG. 3.)

Example 4

A still further one of the aforementioned six silicon wafers was subjected to high-temperature heat treatment according to the present invention under conditions similar to those of Example 1 except that the time of heat treatment was 20 seconds. Subsequently, the wafer was measured for the density of oxidation induced stacking faults. As a result, measurements of the density of oxidation induced stacking faults were up to 20 faults /cm$^2$. (See FIG. 3.)

Example 5

A still further one of the aforementioned six silicon wafers was subjected to high-temperature heat treatment according to the present invention under conditions similar to those of Example 1 except that the time of heat treatment was 40 seconds. Subsequently, the wafer was measured for the density of oxidation induced stacking faults. As a result, measurements of the density of oxidation induced stacking faults was up to 20 faults/cm$^2$. (See FIG. 3.)

The silicon wafers of Examples 1 to 5 were free from generation of hazes due to nitriding at wafer surfaces and generation of slip dislocations, both of which might have occurred due to heat treatment of the present invention. Further, the silicon wafers of Examples 1 to 5 were free from other kinds of crystal defects.

Thus, it was confirmed that the method of the present invention can reliably annihilate oxidation induced stacking faults through heat treatment over a short period of time.

The present invention is not limited to the above-described embodiment. The above-described embodiment is a mere example, and those having the substantially same structure as that described in the appended claims and providing the similar action and effects are included in the scope of the present invention.

For example, in the above-described embodiment, a heat treatment furnace as shown in FIG. 1 is used. However, the present invention is not limited thereto. In principle, any furnaces may be used so long as they are ordinarily used for heat treatment of silicon wafers and can be heated to a temperature of 1000° C. or higher.

What is claimed is:

1. A heat treatment method for a silicon wafer, comprising the steps of:
    contacting a silicon wafer with a solution to thereby intentionally form a natural oxide film on the entire surface of the silicon wafer;
    loading the silicon wafer having the natural oxide film on the entire surface directly into a heat treatment furnace heated to a temperature within a temperature range of 1000° C. to the melting point of silicon;
    heat-treating the silicon wafer at a temperature within the temperature range; and
    unloading the silicon wafer having a temperature within the temperature range from the heat treatment furnace immediately after the heat treatment is completed.

2. A heat treatment method for a silicon wafer according to claim 1, wherein the heat treatment is performed for a period of 1 second to 2 minutes.

3. A heat treatment method for a silicon wafer according to claim 1, wherein the heat-treated silicon wafer has a density of oxidation induced stacking faults of less than 50 faults/cm$^2$.

4. A heat treatment method for a silicon wafer according to claim 1, wherein the heat treatment is performed in the presence of an ambient gas consisting essentially of a gas selected from the group consisting of nitrogen, inert gas and mixtures thereof.

5. A heat treatment method for a silicon wafer according to claim 1, wherein the heat treatment is performed in the presence of an ambient gas selected from the group consisting of nitrogen, inert gas, a mixture of nitrogen and inert gas, and a mixture of any of these gases and at least one of oxygen and water vapor.

6. A heat treatment method for a silicon wafer according to claim 5, wherein the heat treatment is performed for a period of 1 second to 2 minutes.

7. A heat treatment method for a silicon wafer according to claim 5, wherein the heat-treated silicon wafer has a density of oxidation induced stacking faults of less than 50 faults/cm$^2$.

8. A heat treatment method for a silicon wafer according to claim 1, wherein the silicon wafer is heat-treated at a temperature in a range of 1200° C. to 1350° C.

9. A heat treatment method for a silicon wafer according to claim 8, wherein the heat treatment is performed for a period of 1 second to 2 minutes.

10. A heat treatment method for a silicon wafer according to claim 8, wherein the heat-treated silicon wafer has a density of oxidation induced stacking faults of less than 50 faults/cm$^2$.

11. A heat treatment method for a silicon wafer according to claim 8, wherein the heat treatment is performed in the presence of an ambient gas selected from the group consisting of nitrogen, inert gas, a mixture of nitrogen and inert gas, and a mixture of any of these gases and at least one of oxygen and water vapor.

12. A heat treatment method for a silicon wafer according to claim 11, wherein the heat treatment is performed for a period of 1 second to 2 minutes.

13. A heat treatment method for a silicon wafer according to claim 1, wherein the natural oxide film is intentionally formed by cleaning the silicon wafer to be heat-treated in an acid or alkali cleaning solution containing hydrogen peroxide.

14. A heat treatment method for a silicon wafer according to claim 13, wherein the heat treatment is performed for a period of 1 second to 2 minutes.

15. A heat treatment method for a silicon wafer according to claim 13, wherein the heat-treated silicon wafer has a density of oxidation induced stacking faults of less than 50 faults/cm$^2$.

16. A heat treatment method for a silicon wafer according to claim 13, wherein the heat treatment is performed in the presence of an ambient gas selected from the group consisting of nitrogen, inert gas, a mixture of nitrogen and inert gas, and a mixture of any of these gases and at least one of oxygen and water vapor.

17. A heat treatment method for a silicon wafer according to claim 16, wherein the heat treatment is performed for a period of 1 second to 2 minutes.

18. A heat treatment method for a silicon wafer according to claim 13, wherein the silicon wafer is heat-treated at a temperature in a range of 1200° C. to 1350° C.

19. A heat treatment method for a silicon wafer according to claim 18, wherein the heat treatment is performed for a period of 1 second to 2 minutes.

20. A heat treatment method for a silicon wafer according to claim 18, wherein the heat treatment is performed in the presence of an ambient gas selected from the group consisting of nitrogen, inert gas, a mixture of nitrogen and inert gas, and a mixture of any of these gases and at least one of oxygen and water vapor.

21. A heat treatment method for a silicon wafer according to claim 20, wherein the heat treatment is performed for a period of 1 second to 2 minutes.

22. A heat treatment method for a silicon wafer, comprising:
    contacting a silicon wafer with a solution to thereby intentionally form a natural oxide film on the entire surface of the silicon wafer;
    loading the silicon wafer having the natural oxide film on the entire surface directly into a heat treatment furnace heated to a temperature within a temperature range;
    heat-treating the silicon wafer in the heat treatment furnace at a temperature within the temperature range, the heat treatment being performed in the presence of an ambient gas consisting essentially of a gas selected from the group consisting of nitrogen, inert gas and mixtures thereof; and unloading the silicon wafer having a temperature within the temperature range from the heat treatment furnace immediately after the heat treatment is completed.

23. A heat treatment method for a silicon wafer according to claim 22, wherein the solution is a cleaning solution.

24. A heat treatment method for a silicon wafer according to claim 22, wherein the temperature within a temperature range is at least 1000° C.

* * * * *